United States Patent [19]

Strid et al.

[11] Patent Number: 5,047,725
[45] Date of Patent: Sep. 10, 1991

[54] VERIFICATION AND CORRECTION METHOD FOR AN ERROR MODEL FOR A MEASUREMENT NETWORK

[75] Inventors: Eric W. Strid; Andrew C. Davidson, both of Portland, Oreg.

[73] Assignee: Cascade Microtech, Inc., Beaverton, Oreg.

[21] Appl. No.: 443,213

[22] Filed: Nov. 28, 1989

[51] Int. Cl.$^5$ ............................................. G01R 27/04
[52] U.S. Cl. ..................... 324/601; 324/638; 364/571.01
[58] Field of Search ............... 324/601, 74, 77 B, 613, 324/615, 638; 364/571.01, 571.02, 571.04, 571.05

[56] References Cited

U.S. PATENT DOCUMENTS

| 4,414,638 | 11/1983 | Talambiras | 364/571.07 |
| 4,680,538 | 7/1987 | Dalman et al. | 324/601 X |
| 4,816,767 | 3/1989 | Cannon et al. | 324/601 |
| 4,853,613 | 8/1989 | Sequeira et al. | 324/601 |
| 4,858,160 | 8/1989 | Strid et al. | 364/571.01 |

OTHER PUBLICATIONS

Eul et al., "Thru-Match-Reflect: One Result of a Rigorous Theory for De-Embedding and Network Analyzer Calibration" *European Microwave Conference* Dec. (1988) p. 909 et seq.

Ryttling, "Appendix to an Analysis of Vector Measurement Accuracy Enhancement Techniques" Hewlett Packard (1982)/Dec.

"Model 22/42D Instruction Manual," Cascade Microtech, (1987)/Dec. pp. 4-1 through 4-42.

*Primary Examiner*—Jack B. Harvey
*Attorney, Agent, or Firm*—Chernoff, Vilhauer, McClung & Stenzel

[57] ABSTRACT

A method for correcting inaccuracies in error factors of an error model used for vector-corrected, microwave-frequency measurements. Verifying de-embedded measurements are compared to known characteristics of at least one verification standard. At least one parameter of the calibration standards, or an error factor, or measuring network geometry, is changed and the error factors are recalculated to bring the verifying measurements into conformity with the known characteristics of the verification standard.

18 Claims, 3 Drawing Sheets

VERIFICATION AND CORRECTION METHOD FOR AN ERROR MODEL FOR A MEASUREMENT NETWORK

BACKGROUND OF THE INVENTION

The present invention relates to calibration of measurement networks, enabling de-embedding of subsequent microwave circuit measurements. More specifically, the invention provides a method for correcting errors in the error factors of an error model where the errors are caused by inaccurate knowledge of network parameters of calibration standards used as references in the calibration process. Such imperfect assumptions may be caused, for example, by reactance in the measuring circuit due to variable positioning of circuit elements, such as probes, couplings, and the like, as described in Strid et al., U.S. Pat. No. 4,858,160 which is incorporated herein by reference.

Ideally, a microwave circuit's network parameters would be directly measurable. However, at microwave frequencies, the network parameters of the microwave circuit, that is, the device under test (DUT), are hidden within measurements of the "measurement network" which not only includes the DUT, but also the necessary connections, reflectometers, and probes interposed between the DUT and the network analyzer. The DUT is said to be "embedded" within the measurement network.

The characteristics of the measurement network, whether used in a one-port, two-port, or N-port mode, are assumed to be repeatable, and thus may be accounted for in an error model having various error factors describing various parameters of the measurement network. Through use of the error model, network properties of the DUT may be determined from measurements of the measurement network including the DUT. This process is referred to as "de-embedding" the DUT.

The measurement network's parameters, and thus the error factors, may be determined from measurements of the measurement network for various "calibration standards," that is, devices having known network parameters. The number of independent calibrating measurements is at least equal to the number of error factors in the error model. Additional measurements may be averaged to minimize random errors in measurements. However, the accuracy of the determined error factors is limited to the accuracy to which the network parameters of the calibration standards are known.

What is needed is a method of detecting and correcting inaccuracies in error factors and calibration standard network parameters. This method preferably provides additional information on the calibration standards.

SUMMARY OF THE INVENTION

The present invention provides a method for correcting error factors determined from measurements of measurement networks containing various calibration standards.

In accordance with the present invention, a suitable error model is chosen. Its error factors are then determined from various measurements of the measurement network for various calibration standards, as is known in the prior art. Unlike the prior art (other than U.S. Pat. No. 4,858,160), however, since the accuracy of these error factors is dependent on the assumed parameters of the various calibration standards, the error factors are then verified for accuracy by comparing de-embedded measurements of a verification standard, having at least one absolutely known inherent network parameter, with the standard's known behavior. More than one verification standard may be used in this verification process.

If the measured parameter of the verification standard does not match its known behavior, the error factors are inaccurate and need to be corrected. This correction may be done using any one of at least three different methods: (1) one of the error factors may be changed directly; (2) one of the parameters which had been presumed to be known regarding at least one of the calibration standards may be changed; or (3) the measurement network may be changed so that it more closely approximates assumptions used in calculations. The latter two methods require recalculating the adjusted error factors. Once the adjusted error factors are determined, they may be used to again compare a verification standard's measured parameters with its known behavior, yielding information on additional adjustments, if necessary.

Unlike the method of the aforementioned U.S. Pat. No. 4,858,160, the method of the present invention enables not only calibration of one-port but also multi-port measurements, and is capable of calibrating using measurements of calibration standards at a single frequency rather than requiring measurements at multiple frequencies. "Multi-port" is used herein to mean at least two ports.

The foregoing and other objectives, features and advantages of the present invention will be more readily understood upon consideration of the following detailed description of the invention taken in conjunction with the accompanying drawings.

DESCRIPTION OF THE INVENTION

Figure 1:
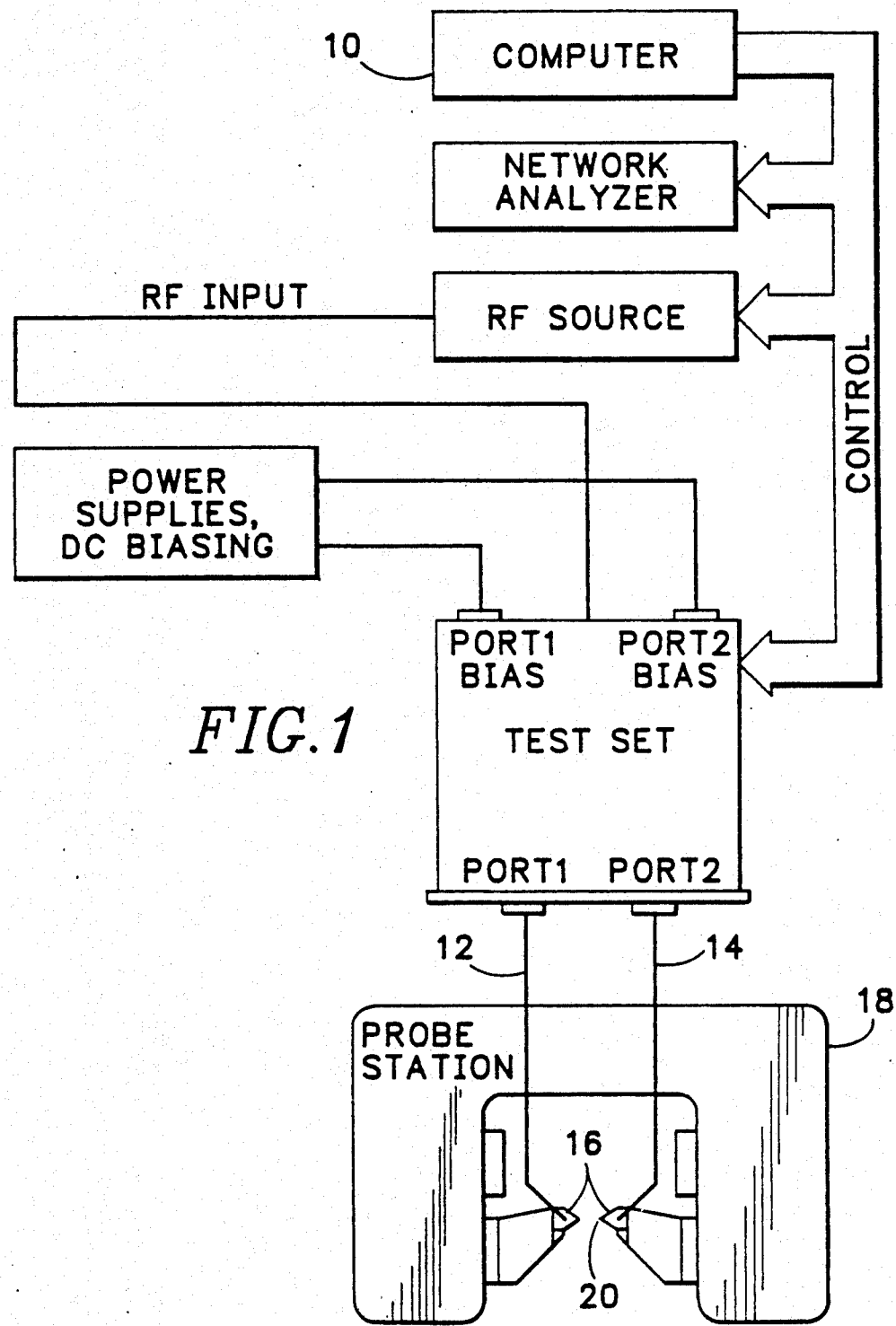
FIG. 1 is a simplified schematic diagram of a typical computer-operated network analyzer and associated probe station for measuring microwave integrated circuits.

A typical block diagram of a conventional network analyzer for measuring microwave integrated circuits (such as a Hewlett Packard model HP8510 analyzer) is shown in FIG. 1. The analyzer may be controlled by its own computer 10, or alternatively, by an external computer, and is connected by transmission lines 12, 14 to respective probe heads 16 of a conventional probe station 18. Each probe head 16 has a respective probe tip 20 for contacting and performing measurements on integrated circuits and impedance standards. These impedance standards may be used as calibration standards, verification standards, or both calibration and verification standards. The probe tip 20 may be of the coplanar wave guide type shown, for example, in U.S. Pat. No. 4,697,143, which is incorporated herein by reference.

Figure 2:
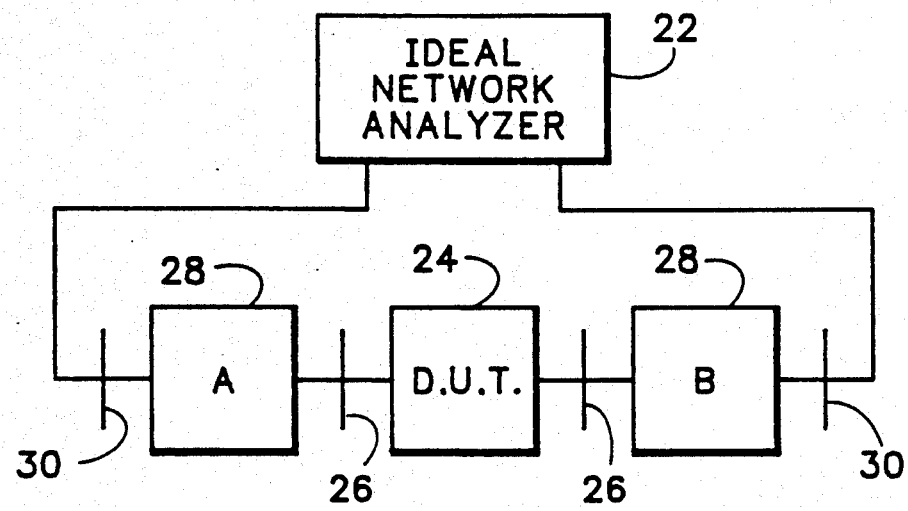
FIG. 2 is a block diagram of a measurement system showing measurement planes.

A general error model is shown in FIG. 2. An ideal network analyzer 22 is connected to a device under test (DUT) 24. Interposed between the desired measurement planes 26 and the network analyzer are error networks 28 which model the behavior of the transmission lines, test set, probe heads, and other circuitry interposed between the DUT and the actual measurement planes 30. All circuitry between the actual measurement planes is called the "measurement network" herein.

As is well known in the prior art, the error factors of the error networks 28 may be determined from measurements of the measurement network including various known calibration standards. However, the accuracy of these determined error factors is dependent on the accuracy to which the calibration standard's network parameters are known; an error in the characterization of a calibration standard causes corresponding errors in the error factors.

By means of the present invention, these errors can be detected and corrected through the use of a verification standard that has at least one absolutely known inherent network parameter which is independent of frequency. For example, an offset short's or an offset open's reflection coefficient may have a magnitude of one, regardless of its phase. Alternatively, frequency dependent parameters such as the relationship between the phase of the reflection coefficient and the length of a transmission line stub is an inherent parameter which may be known and used to detect inaccuracies in the error factors. Frequency-independent parameters can be measured at a single frequency to expedite the process. Furthermore, two verification standards may be used when their relative network parameters are known. For example a first verification standard may have twice the delay, or half the capacitance, of a second verification standard.

The measurement network is measured with a verification standard in place of a DUT. The initial error factors are used to de-embed the verification standard's inherent parameter. Any variations between the measurements and the actual known inherent parameter can be attributed to errors in the error factors and is termed herein a "modeling error."

In general, there are at least three methods of correcting a modeling error. The first is to alter directly at least one of the error factors. The new resulting set of error factors can then be used to determine the existence of a modeling error, which can then be used to determine what changes are necessary in the altered error factors to minimize the modeling error.

The second method of correcting a modeling error is to recalculate the error factors using an altered network parameter for at least one of the calibration standards. The new resulting set of error factors can then be used to determine the existence of the modeling error, and what change is necessary to the calibration standard's network parameter to minimize the error. This method of correcting the modeling error has the added benefit of also correcting inaccurate information on the calibration standards' network parameters.

The third method of correcting a modeling error is to alter the measurement network so that its characteristics more closely match any assumptions used in the calibration calculations. For example, if the calibration calculation assumes a zero reactance at the probe/calibration contact pad junction, then the overlap of the probe heads on the contact pads may be changed to minimize any such reactance.

Figure 3:
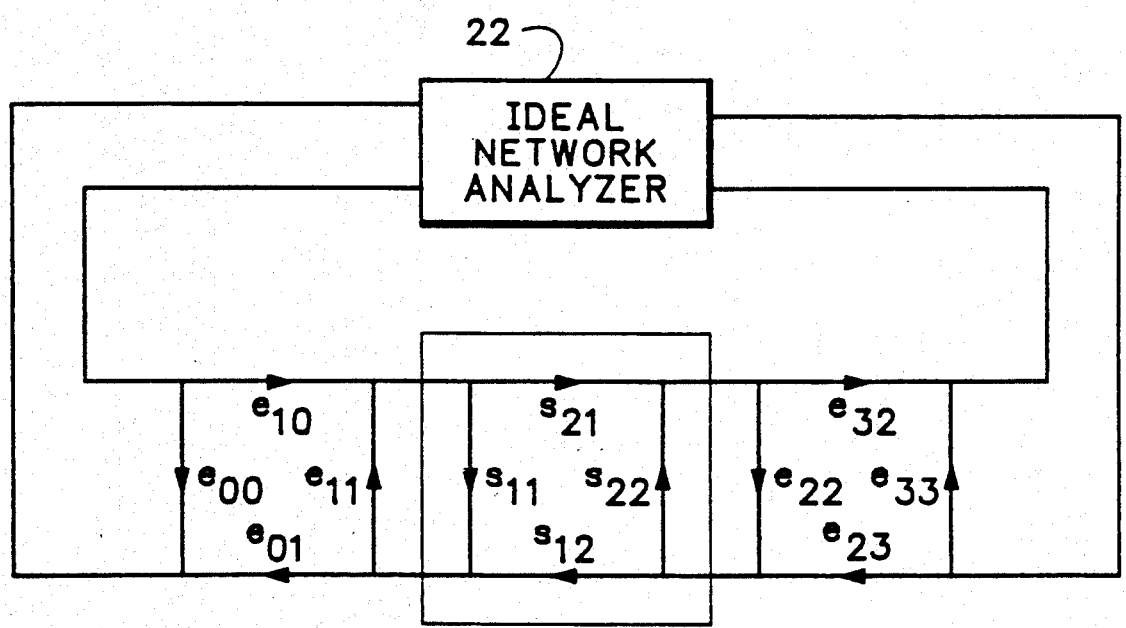
FIG. 3 is a block diagram of a measurement system including an exemplary error model.

In an exemplary embodiment of the present invention using the aforementioned third method, an error model having eight error factors is used to correct measurements of two-port microwave devices. As shown in FIG. 3, these eight error factors are $e_{00}$, $e_{01}$, $e_{10}$, $e_{11}$, $e_{22}$, $e_{23}$, $e_{32}$, and $e_{33}$. Of these eight complex error factors, seven are independent, allowing one of eight error factors to be arbitrarily assigned a complex value such as unity for convenience. The remaining seven complex error factors can be determined with seven complex measurements of the measurement network as is well known in the prior art. See, for example "Appendix to an Analysis of Vector Measurement Accuracy Enhancement Techniques" by Doug Rytting, and published by Hewlett Packard, and "Thru-Match-Reflect: One Result of a Rigorous Theory for De-Embedding and Network Analyzer Calibration" by H.-J. Eul and B. Schiek published in the 1988 European Microwave Conference, both of which are incorporated herein by reference.

In this exemplary embodiment, the measurement network's various reflection or transmission parameters are measured for three calibration standards having assumed characteristics. The first calibration standard is a "Thru" or a short transmission line resulting in four complex knowns. The next calibration standard is a matched "Load" connected to each probe. Its complex reflection coefficient is assumed to be zero, thus yielding two more complex knowns. The final calibration standard is a "Reflect," which may be typically a Short or an Open. Since an Open is more readily available, merely requiring the probe tips to be lifted a minimum distance, it is the one used in this embodiment. As the complex reflection coefficient of port one is assumed to be equal to the reflection coefficient of port two, this third calibration standard yields one more complex known. From these fourteen measurements, that is, seven complex measurements, the seven independent complex error factors are calculated.

In this exemplary embodiment, the Load is assumed to be a perfect load, that is, $Z = Z_0 + j0$. Therefore, the Load must be contacted such that it has zero reactance relative to the launch characteristics of the Thru. For 150 micron pitch probes and 25 microns of overlap on the Thru, the Load should be contacted also with about 25 microns of overlap.

Figure 4:
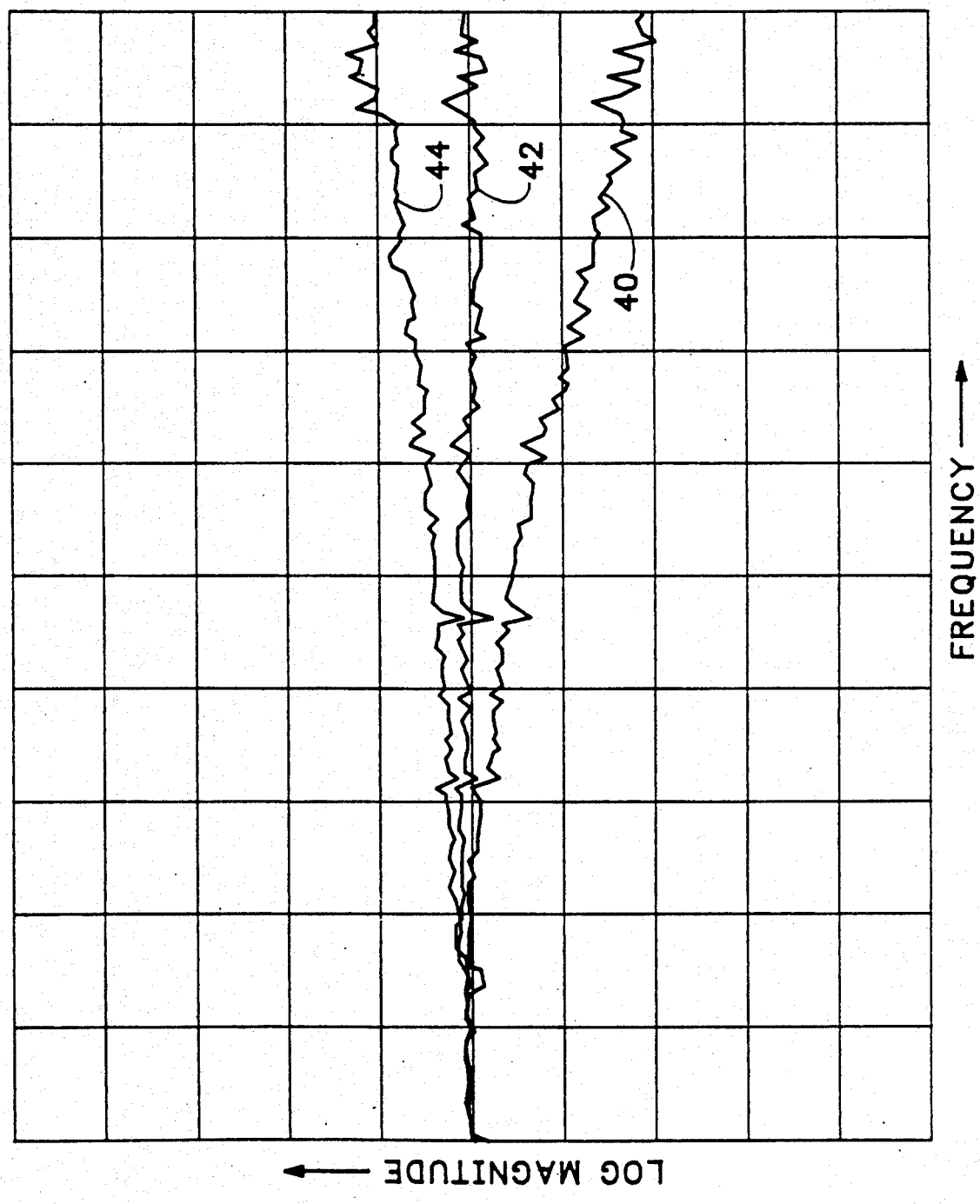
FIG. 4 is a graph showing the magnitude of the reflection coefficient for an "open" verification standard versus frequency.

To verify that proper overlap was used in calibration, resulting in accurate error factors, the magnitude of the reflection coefficient for the Open is de-embedded over a range of frequencies. Since the de-embedded magnitude should remain constant at 0 Db over the range of frequencies, any increase or decrease with frequency can be attributed to a modeling error. To correct the modeling error, the calibration standard measurements and de-embedding calculations of the error factors are repeated with different probe overlaps until an optimum overlap is indicated by a constant magnitude over the frequency range. FIG. 4 shows the effects of (a) no overlap 40, (b) 25 microns 42 (the correct amount), and (c) 50 microns of overlap 44 for 150 micron pitch probes used in three separate calibrations.

Alternatively, since the magnitude of the reflection coefficient of the Open is independent of frequency, the verification measurement could be performed at only a single frequency to determine the deviation of the de-embedded magnitude from the absolutely known value of one, thereby also indicating the existence and degree of the modeling error.

This exemplary method demonstrates that the impedance standard serving as a verification standard may be one of the calibration standards, as the Open is used for both in this instance.

The exemplary method just described could alternatively be performed using the second method of verification and correction mentioned above. The initial verification would occur as described above, assuming the Load's reactance to be zero. However, any modeling error would be ascribed to this assumption being incorrect. An arbitrary reactance would then be assigned to the Load, and the calibration and verification calculations would then be performed using this new information. Modeling error then present would indicate what further changes are necessary to the Load's reactance to minimize the modeling error, and thus improve the accuracy of the error factors.

In another exemplary method of verifying and correcting the calibration of one-port measurements, the measurement network would be initially calibrated as described in Strid et al., U.S. Pat. No. 4,858,160 using a Short, and Open, and a Load as the calibration standards. Assume that the Short reactance is specified, thereby setting the reference plane for the measurements. Then, the open circuit capacitance ($C_{OPEN}$) and the load inductance ($L_{TERM}$) are unknown. The resulting calibration may be verified by de-embedding the measurement of a known one-port verification standard at a single frequency. The resulting modeling error may be decreased by altering both $C_{OPEN}$ and $L_{TERM}$.

The terms and expressions which have been employed in the foregoing specification are used therein as terms of description and not of limitation, and there is no intention, in the use of such terms and expressions, of excluding equivalents of the features shown and described or portions thereof, it being recognized the scope of the invention is defined and limited only by the claims which follow.

What is claimed is:

1. A method for correcting a multi-port error model having N error factors, where N is a predetermined integer, said N error factors being determined from at least N measurement taken with calibration standards in a multi-port measurement network, said method comprising the steps of:
   (a) measuring a network parameter of said multi-port measurement network including a verification standard having a known network parameter to obtain a verification measurement;
   (b) de-embedding said verification measurement using said N error factors;
   (c) comparing said de-embedded verification measurement with said known network parameter to obtain a modeling error; and
   (d) systematically altering at least one of said N error factors to obtain new error factors such that a new de-embedded verification measurement using said new error factors reduces said modeling error.

2. The method of claim 1 wherein said altering of said error factors includes altering one of said network parameters for one of said calibration standards.

3. The method of claim 1 wherein said altering of said error factors includes altering said measurement network.

4. The method of claim 3 wherein said altering of said measurement network includes altering the position of a contact probe.

5. The method of claim 1 wherein said step (a) includes measuring a network parameter at more than one frequency.

6. The method of claim 1 wherein said step (a) includes measuring a network parameter which is independent of frequency.

7. The method of claim 1 wherein said verification standard is composed of first and second component verification standards that have network parameters in known relation.

8. A method for calibrating multi-port measurements of a multi-port measurement network using an error model having N error factors, where N is a predetermined integer, comprising the steps of:
   (a) measuring network parameters of said multi-port measurement network, including at least one calibration standard having partially known network parameters, to obtain at least N independent measurements;
   (b) calculating said N error factors from said independent measurements;
   (c) measuring a network parameter of said measurement network including a verification standard having a known network parameter to obtain a verification measurement;
   (d) de-embedding said verification measurement using said N error factors;
   (e) comparing said de-embedded verification measurement with said known network parameter to obtain a modeling error; and
   (f) systematically altering at least one of said N error factors to obtain new error factors such that a new de-embedded verification measurement using said new error factors reduces said modeling error.

9. The method of claim 8 wherein said altering of said error factors includes altering one of said network parameters for one of said calibration standards.

10. The method of claim 8 wherein said altering of said error factors includes altering said measurement network.

11. The method of claim 10 wherein said altering of said measurement network includes altering the position of a contact probe.

12. The method of claim 8 wherein said step (c) includes measuring a network parameter at more than one frequency.

13. The method of claim 8 wherein said step (c) includes measuring a network parameter which is independent of frequency.

14. A method for calibrating measurements of a measurement network using an error model having N error factors, where N is a predetermined integer, comprising the steps of:
   (a) measuring network parameters of said measurement network, including at least one calibration standard having partially known network parameters, to obtain at least N independent measurements;
   (b) calculating said N error factors from said independent measurements;
   (c) measuring a network parameter of said measurement network including a verification standard having two network parameters in known relation which are independent of frequency to obtain a verification measurement;
   (d) de-embedding said verification measurement using said N error factors;

(e) comparing said de-embedded verification measurement with said known relation of said two network parameters to obtain a modeling error; and (f) systematically altering at least two of said N error factors to obtain new error factors such that a new de-embedded verification measurement using said new error factors reduces said modeling error.

15. The method of claim 14 wherein said step (c) includes measuring a network parameter at only a single frequency.

16. The method of claim 14 wherein said altering of said error factors includes altering two of said network parameters of said calibration standards.

17. The method of claim 14 wherein said altering of said error factors includes altering said measurement network.

18. The method of claim 17 wherein said altering of said measurement network includes altering the position of a contact probe.

* * * * *